United States Patent [19]
Stojkovic et al.

[11] Patent Number: 5,490,663
[45] Date of Patent: *Feb. 13, 1996

[54] SLIDE ACTUATED HOLDING CLAMP

[75] Inventors: Dragan B. Stojkovic, Wyandotte; George L. Justus, Northville, both of Mich.

[73] Assignee: United Technologies Automotive, Inc., Dearborn, Mich.

[*] Notice: The term of this patent shall not extend beyond the expiration date of Pat. No. 5,277,411.

[21] Appl. No.: 130,380

[22] Filed: Oct. 1, 1993

Related U.S. Application Data

[63] Continuation-in-part of Ser. No. 927,450, Aug. 7, 1992, Pat. No. 5,277,411.

[51] Int. Cl.⁶ ................................................. B23Q 3/08
[52] U.S. Cl. .............................. 269/32; 269/94; 269/233; 269/903
[58] Field of Search ................................ 269/32, 93, 94, 269/237, 238, 233, 234, 903; 29/760, 281.1

[56] References Cited

U.S. PATENT DOCUMENTS

| | | |
|---|---|---|
| 3,027,155 | 3/1962 | Paterson . |
| 3,565,415 | 7/1968 | Blatt ............................................. 269/32 |
| 3,570,835 | 3/1971 | McPherson ................................. 269/32 |
| 3,724,837 | 4/1973 | McPherson ................................. 269/32 |
| 3,727,500 | 4/1973 | Breetvelt ..................................... 269/32 |
| 4,444,739 | 1/1985 | Valentine ..................................... 269/32 |
| 4,445,676 | 5/1984 | Tunkers . |
| 4,451,026 | 5/1984 | Coope . |
| 4,618,131 | 10/1986 | Campisi et al. ............................ 269/32 |
| 4,673,173 | 6/1987 | Shochi et al. . |
| 4,723,767 | 2/1988 | McPherson et al. . |
| 4,777,445 | 10/1988 | Kahl . |
| 4,834,663 | 5/1989 | Kahl . |

*Primary Examiner*—Robert C. Watson
*Attorney, Agent, or Firm*—Harness, Dickey & Pierce

[57] ABSTRACT

A slide actuated holding clamp for holding a connector stationary while a push test or pull test is performed on a conductor secured to the connector. The clamp comprises a main body portion having an opening formed therein, a locking member adapted to fit nestably substantially within the opening, and an actuating member adapted to fit nestably within a recessed portion in the locking member. The actuating member is pivotally coupled to an upper end portion of the locking member and the locking member is captively held within the opening in the main body portion by a locking pin. The locking member includes elongated openings which allow the locking member to be urged slidably longitudinally within the main body portion as the actuating member is moved in first and second longitudinal directions. The pivotal coupling of the actuating member and locking member allows the locking member to be urged pivotally into abutting engagement with a connector as the actuating member is moved in a first linear direction. The elongated apertures permit the actuating member to urge the locking member generally linearly in the same direction as the actuating member as the actuating member continues to be moved in the first direction. This causes the locking member to exert a positive clamping force on the connector prior to conducting a push test or pull test.

7 Claims, 4 Drawing Sheets

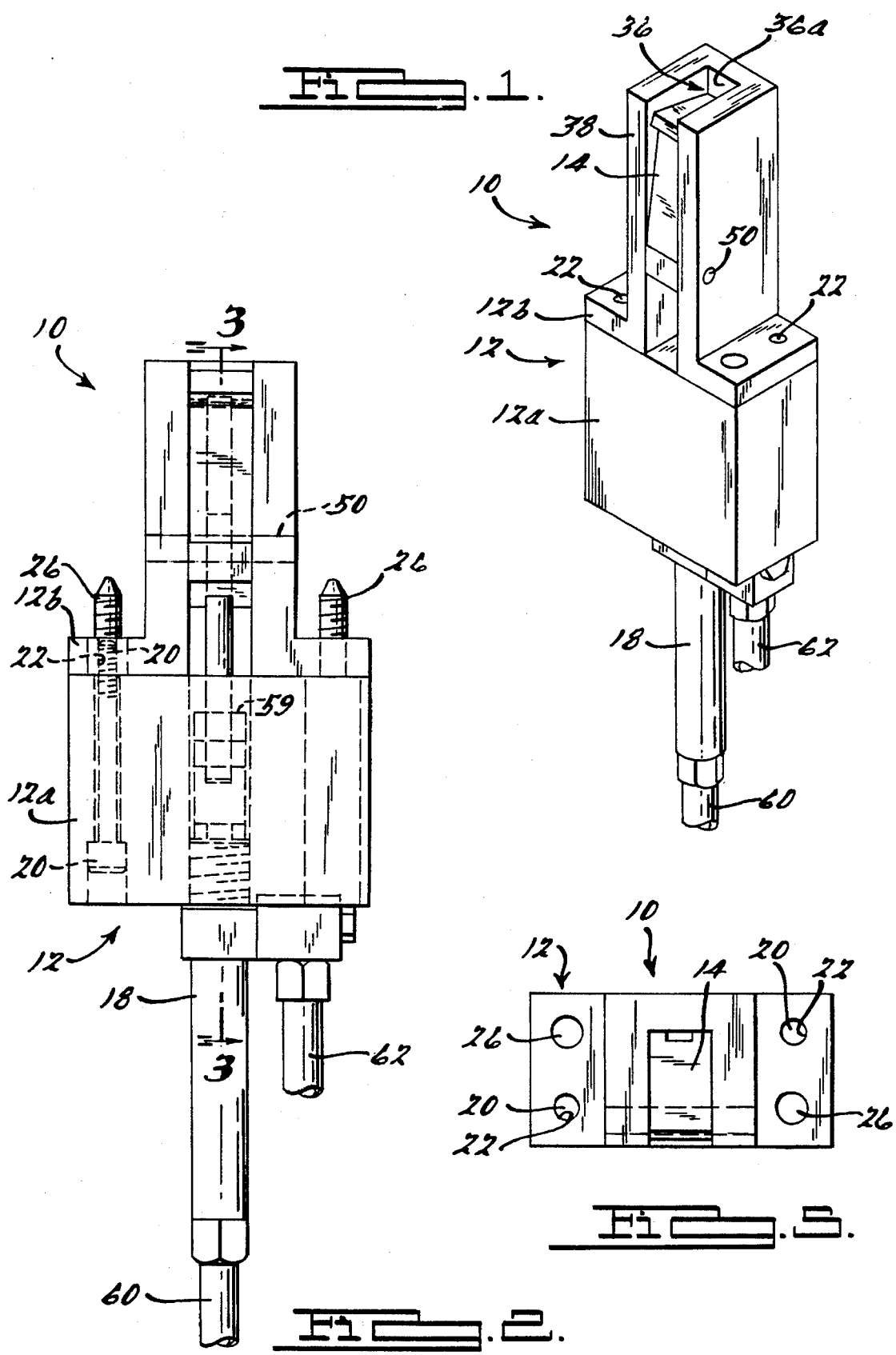

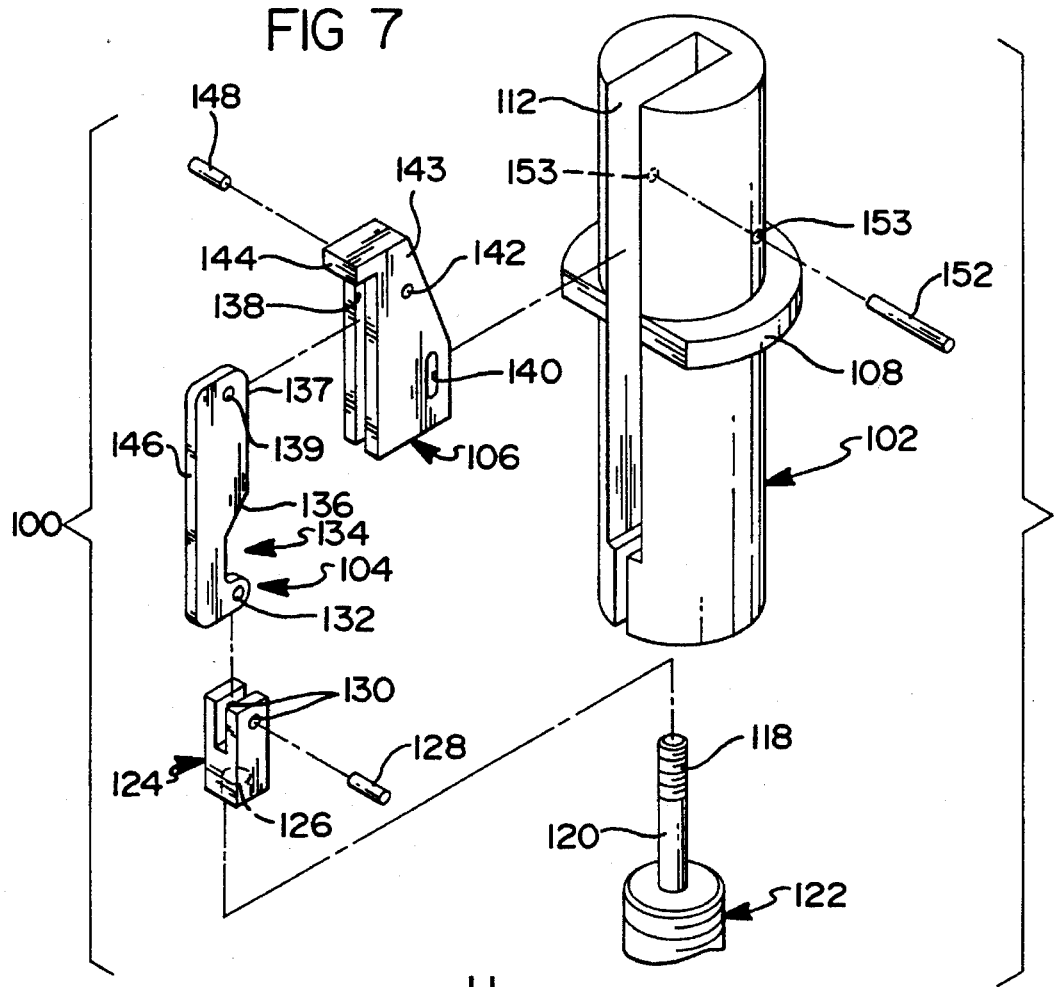
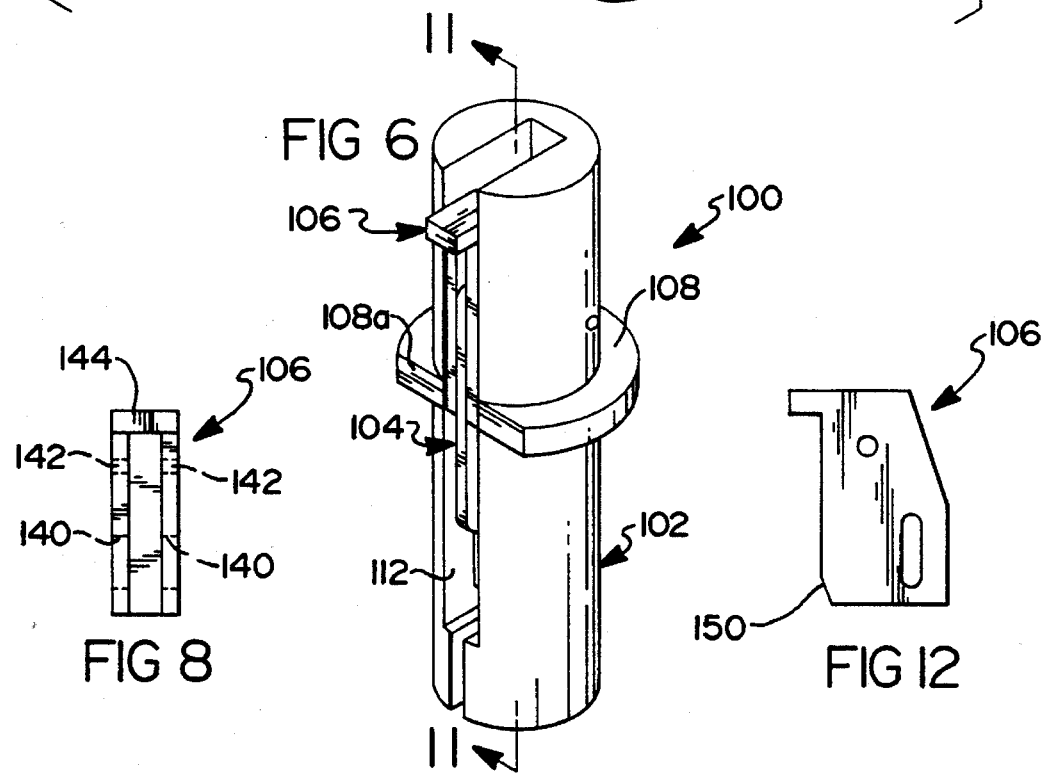

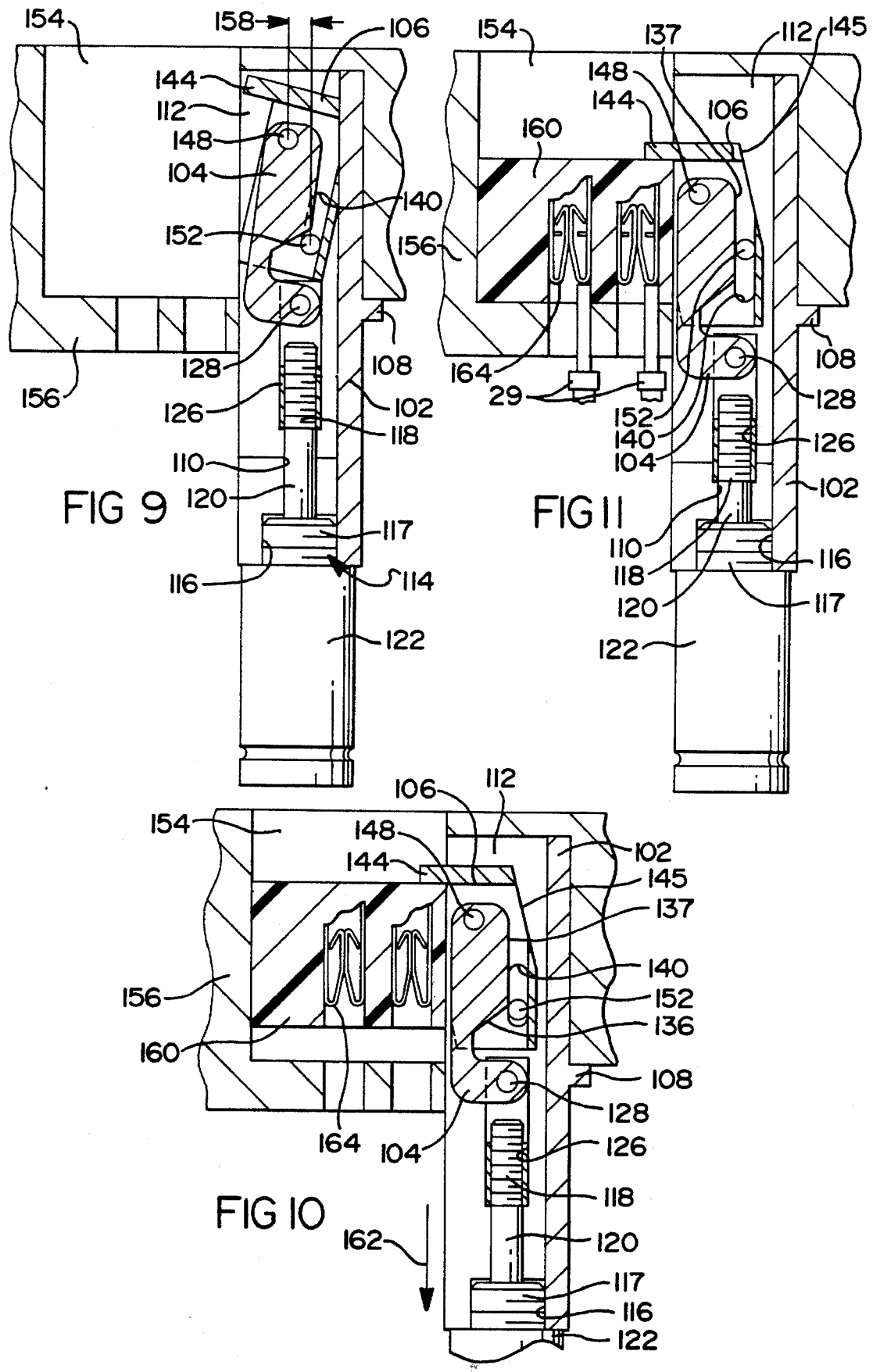

SLIDE ACTUATED HOLDING CLAMP

CROSS REFERENCE TO RELATED APPLICATION

This application is a Continuation-In-Part application of U.S. application Ser. No. 07/927,450, which was filed on Aug. 7, 1992, and now U.S. Pat. No. 5,277,411.

BACKGROUND OF THE INVENTION

1. Technical Field

This invention is related to clamping mechanisms, and more particularly to a slide actuated holding clamp for holding a connector of a vehicle wiring harness securely stationary while a push test is performed on a conductor secured to the connector.

2. Discussion

Clamping mechanisms are used in a wide variety of applications. One application in particular where such devices are helpful is in enabling off line harness testing to be performed on electrical connectors such as those used on a vehicle wiring harness. To help ensure that electrical terminals are going to remain coupled to their associated connectors and will not become disengaged from their connectors due to tension exerted along various lengths of the wiring harness, such as during the assembly of a vehicle, or from vibration, jarring, etc., "push tests" are frequently conducted on connector assemblies. Push tests involve applying a force to the end of a terminal of a conductor while the terminal is secured to its associated connector. Typically, a test force of about five pounds is applied to the terminal of the electrical conductor while the terminal is releasably secured to an associated connector.

In order to hold the connector stationary during a test the connector is typically fitted into a mounting block or a test module which consists of a pocket with some form of holding device coming over a rear end portion of the connector. Since many connectors have multiple terminals connected thereto, and often as many as fifty or more terminals to a single connector, when a five pound test force is applied to each terminal the total force exerted on the connector may range up to or over 250 pounds.

Previously designed holding devices typically used an air cylinder having a diameter which was required to be in proportion to the push force being applied to the connector. Accordingly, for connectors with many terminals a relatively large cylinder was required to supply an adequate holding force to securely hold the connector stationary in response to large push forces being exerted on the connector. Since there is generally very limited space in which to locate the air cylinder, the amount of holding force that could be applied to a connector, and thus the number of terminals that may be checked during a single push test, was limited to the construction of the mechanism and the diameter of the air cylinder which could be implemented into the mounting block or test module holding the connector under test.

Previously designed holding devices typically have not been able to provide a force component which causes a connector to be positively secured to a mating connector portion or mounting block during the push test. Thus, while many prior designs have worked well to prevent a connector from moving or otherwise being unconnected from its mating connector portion or mounting block during a push test, it would be even more desirable to provide some form of positive clamping force which serves to even more positively seat a connector with its mating connector portion or mounting block prior to beginning a push test.

Accordingly, it is a principal object of the present invention to provide a slide actuated holding clamp apparatus that is very compact and which is well adapted to fit many different test applications involving electrical connectors.

It is a further object of the present invention to provide a slide actuated holding clamp apparatus which is operable to securely hold a connector under test, where the connector has a relatively large plurality of terminals connected thereto, upon each of which is exerted a test push force of about five pounds, and which will hold the connector securely stationary with a minimum amount of force being exerted by active (i.e., moving) components of the clamp.

It is yet another object of the present invention to provide a slide actuated holding clamp apparatus which is relatively compact, inexpensive to manufacture, and adapted for use with a wide variety of electrical connectors.

It is still another object of the present invention to provide a slide actuated holding clamp apparatus which may be pneumatically controlled via a suitable external fluid pressure supply device such as an air compressor.

It is yet another object of the present invention to provide a slide actuated holding clamp apparatus which also functions to firmly "seat" a connector as the apparatus clampingly engages the connector, thereby ensuring that the connector is properly seated before a pull or push test begins.

SUMMARY OF THE INVENTION

The above and other objects are provided by a slide actuated holding clamp apparatus in accordance with preferred embodiments of the present invention. The apparatus generally comprises a body portion having a bore therethrough. A portion of the body portion further opens onto a lower surface of the body portion. A locking member is disposed within the body portion and includes a finger portion protruding outwardly therefrom. An actuating member is slidably disposed within the body portion and is operable to urge the locking finger portion of the locking member outwardly as the actuating member is moved in a first direction, and to cause the locking finger portion to be retracted to a position within the body portion when the actuating member is moved slidably in a second direction.

For causing the actuating member to be moved in the first and second directions a fluid responsive actuating cylinder is included. The actuating cylinder is coupled to the actuating member and causes the actuating member to move in the first and second directions in response to the application and removal of fluid pressure to the actuating cylinder. In the preferred embodiment of the present invention the actuating cylinder comprises an air cylinder.

In a first preferred embodiment of the present invention the locking member is further secured within the main body portion via a pivot pin. The locking member is caused to pivot about the pivot pin as the actuating member is moved slidably in the first and second directions by the air cylinder.

In the first preferred embodiment the actuating member further includes a pin member extending generally transversely therethrough, and the locking member further includes a lower shoulder portion. The pin member of the actuating member operates to engage the lower shoulder portion when the actuating member is moved slidably in the second direction, which in turn causes the locking member to pivot about the pivot pin, thereby causing the locking finger portion to be retracted to a position within the main body portion.

The first preferred embodiment of the present invention is capable of holding a connector securely with a minimum amount of force applied by the components of the apparatus, while a relatively large push force is applied to conductors releasably secured to the connector, and even when the push force ranges from 100 to 200 pounds or more. The first preferred embodiment of the present invention further enables a smaller than heretofore normally required air cylinder for holding a connector stationary while a relatively large push force is exerted on a conductor releasably coupled to the connector.

In an alternative preferred embodiment of the present invention an apparatus is disclosed which not only operates to positively clamp a connector prior to a push or pull test being initiated, but which also functions to apply a positive force against the connector body to firmly seat the connector within the mounting block prior to the test being initiated. This embodiment generally includes a main body portion, an actuating member, a locking member and a fluid responsive flow cylinder. The fluid responsive flow cylinder is operably coupled to the actuating member to urge the actuating member generally linearly in response to the application of fluid pressure from an external fluid source. The actuating member, when moved from a fully unlocked position to a locked position, initially causes the locking member to be urged outwardly of the main body portion so as to overlay at least a portion of a connector to be secured prior to a push or pull test being performed. As the actuating member urges the locking member into engagement with the connector it also positively urges the connector into locking engagement with its associated connector portion, and maintains the connector securely engaged with its mating connector portion during the test. Accordingly, the connector will not only be held firmly seated during the test, but the positive clamping or "pulling" force exerted by the apparatus as it engages the connector body serves to ensure that the connector is securely coupled to its mating connector portion.

BRIEF DESCRIPTION OF THE DRAWINGS

The various advantages of the present invention will become apparent to one skilled in the art by reading the following specification and subjoined claims and by referencing the following drawings in which:

FIG. 1 is a perspective view of a slide actuated holding clamp apparatus in accordance with a preferred embodiment of the present invention;

FIG. 2 is an elevational side view of the apparatus of FIG. 1;

FIG. 5 is an end view of the apparatus of FIG. 1.

FIG. 6 is an elevational view of an alternative preferred embodiment of the present invention;

FIG. 7 is an exploded perspective view of the apparatus of FIG. 6;

FIG. 8 is a front view of the locking member of the present invention;

FIG. 9 is a cross-sectional view of the apparatus of FIG. 11 showing the apparatus in a completely unlocked position and secured adjacent to a conventional mounting block structure, ready to receive a connector prior to a push or pull test being conducted;

FIG. 10 is view showing the apparatus of FIG. 9 in an intermediate locked position wherein the locking member has just engaged the connector body but has not yet exerted a positive downward force on the connector body to urge it in the secure engagement with the mounting block;

FIG. 11 is a view of the apparatus in accordance with section line 11—11 in FIG. 6 showing the apparatus in the position it assumes after it has positively urged the connector shown in FIG. 10 downwardly into secure engagement within the mounting block; and FIG. 12 is a side view of an alternative preferred form of locking member having a cut-off corner portion.

DETAILED DESCRIPTION OF THE PREFERRED EMBODIMENT

Figures 3, 4:
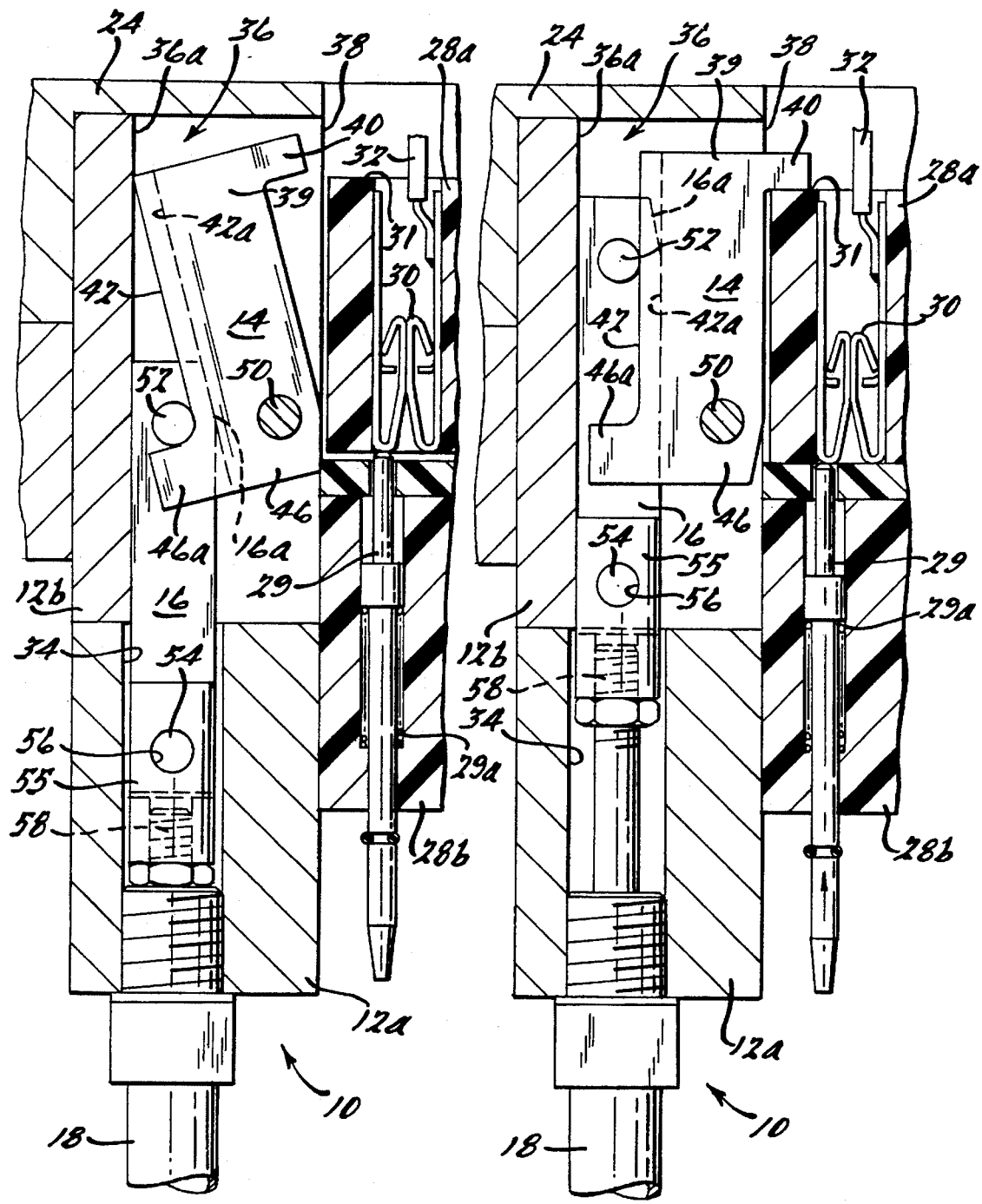
FIG. 3 is a side cross sectional view of the apparatus of FIG. 2 taken in accordance with section line 3—3 in FIG. 2 showing the apparatus with its locking member retracted and positioned to secure a connector thereto.
FIG. 4 is a view of the apparatus of FIG. 3 showing the locking member after it has been urged into locking engagement with the connector.

Referring to FIGS. 1 through 5, a slide actuated holding clamp apparatus 10 in accordance with a preferred embodiment of the present invention is illustrated. The apparatus 10 generally comprises a body portion 12 having body members 12a and 12b, a locking member 14 (FIGS. 3 and 4), a slidable actuating member 16, and a fluid responsive flow cylinder 18 which, in the preferred embodiment, may comprise a conventional, pneumatically actuated air cylinder.

Referring to FIGS. 2 and 5, the body members 12a and 12b are secured releasably together via a pair of threaded screws 20 which extend through body member 12a into threaded apertures 22 in body member 12b. While the body portion 12 has been shown in a two piece configuration, it will be appreciated that a single piece body member could be employed if so desired, and that a two piece design merely simplifies somewhat the assembly of the apparatus 10. In FIGS. 3 and 4, the apparatus 10 is shown releasably secured to a mounting block 24. This is accomplished preferably via a pair of threaded screws, such as threaded screws 26 shown in FIGS. 2 and 5. Electrical connectors 28a and 28b are also illustrated. Connector 28a has a terminal 30 electrically connected to a conductor 32 in the form of a wire. Connector 28b includes a terminal pin 29 biased upwardly by a spring 29a of sufficient construction to generate an upward push force of about 5 pounds as it is compressed.

With reference to FIGS. 2–4, the body member 12a of body portion 12 includes a bore 34 extending generally longitudinally through a midpoint thereof. Body member 12b includes an opening forming a channel 36 which opens onto a lower surface 38 thereof. The channel 36 and bore 34 are further longitudinally aligned when the body members 12a and 12b are releasably secured together. Referring to FIGS. 3 and 4, disposed within the channel 36 is the locking member 14. Locking member 14 includes an upper end 39 having a locking finger portion 40 which extends perpendicularly relative to the body portion 12 and outwardly of the channel 36 when the locking member 14 is positioned as shown in FIG. 4. The locking member 14 further includes a generally planar wall portion 42 having a channel 42a extending longitudinally therealong. A portion 16a of the actuating member 16 extends within the channel 42a. A lower end portion 46 of the locking member 14 includes a lower shoulder portion 46a which protrudes into the channel 36 to a position closely adjacent a bottom wall 36a of the channel 36 when the locking member 14 is positioned with the locking finger portion 40 extending outwardly of the channel 36.

A pivot pin 50 extends through the lower end portion 46 of the locking member 14 and transversely through the second body member 12b to enable the locking member 14 to move pivotally relative to the body portion 12. The actuating member 16 also includes a pin member 52 extending transversely therethrough and positioned to abuttingly engage the planar wall portion 42 of the locking member 14 when the locking member 14 has been moved in a first direction to a position near the upper end 39 of the locking member 14, as shown in FIG. 4.

The air cylinder 18 is coupled to the actuating member 16 via a linkage rod 58 which is secured threadably to a clevis 55. The clevis includes an aperture 56 which extends transversely therethrough. A coupling pin 54 extends through the aperture 56 in the clevis 57 and through a bore 59 in the actuating member 16 (also shown in FIG. 2). Accordingly, linear movement of the linkage rod 58 by the air cylinder 18 causes a corresponding linear movement of the actuating member 16.

With brief reference again to FIG. 2, the air cylinder 18 is illustrated as having a first air supply conduit 60 and a second air supply conduit 62. First air supply conduit 60 enables pressurized air to be applied to a first side of a piston (not shown) within the air cylinder 18, to thereby urge the piston upwardly in a first direction toward the locking member 14. The second conduit 62 enables pressurized air to be applied to the opposite side of the piston to cause the piston to be urged in a longitudinally opposite second direction, or away from the locking member 14. It will be appreciated, however, by those skilled in the art that numerous, conventional fluid responsive mechanisms may be employed to provide pressurized air and/or a vacuum to cause the piston within the air cylinder 18 to move in the first and second directions. Additionally, it will be appreciated that well known electrically energized solenoids may also be employed to perform the operation of air cylinder 18.

Turning now to the operation of the apparatus 10, when air pressure is first applied to first air supply conduit 60, the piston within the air cylinder 18 is driven upwardly in the first direction causing the linkage rod 58, clevis 55 and the actuating member 16 to be driven in the first direction into the position shown in FIG. 4. As the actuating member 16 is driven slidably upwardly in the first direction along a bottom wall 36a of the channel 36, the outer surface of the pin member 52 slidably moves along the planar wall portion 42 of the locking member 14, thus urging the upper end portion 39 of the locking member 14 clockwise (when viewing FIGS. 3 and 4), to thereby urge the locking finger portion 40 outwardly of the channel 36. The locking finger portion 40 engages an edge portion 31 of the connector 28a to forcibly urge the connector 28a downwardly against the terminal pin 29 and the counteracting push force of spring 29. The locking finger portion 40 thus releasably secures the connector 28a stationary while the push force is exerted upwardly on the terminal pin 29 by spring 29a against terminal 30. If the terminal 30 is not seated securely within the connector 28a the terminal 30 will be forced upwardly by the terminal pin 29 out of the connector 28a.

It should be appreciated that when the actuating member 16 is extended fully in the first direction, thus urging the locking finger portion 40 outwardly, only a very small force will be required to be exerted on the actuating member 16 in the first direction in order to maintain the locking member 14 in the position shown in FIG. 4. This will be so even though a relatively large total push force, for example, 100 to 200 pounds, is exerted on the connector 28a. Thus, a relatively large air cylinder 18 is not required. Accordingly, an air cylinder having a much smaller diameter and more compact shape may be employed which would otherwise not be possible with prior art holding clamp mechanisms.

With reference to FIG. 3, when the locking finger portion 40 is to be retracted, air pressure is supplied through the second air supply conduit 62 which applies air pressure to a side of the piston within the air cylinder 18 opposite to the side of the piston to which air pressure was supplied via air supply conduit 60. It will also be appreciated that at this point the first air supply conduit 60 will by some conventional means (e.g., a three-way valve) be vented to atmosphere to enable the piston within the air cylinder 18 to moved in the second direction away from the body portion 12a.

When air pressure is supplied through the second air supply conduit 62, it causes the piston within the air cylinder 18 to move downwardly in the second direction, thus moving the clevis 55 and the actuating member 16 downwardly in the second direction. The pin member 52 of the actuating member 16 moves slidably down the planar wall portion 42 into abutting engagement with the lower shoulder portion 46a of the locking member 14. The pin member 52, as it continues downwardly in the second direction, forces the lower shoulder portion 46a to move pivotally in a counter clockwise manner, when viewing FIG. 3, about pivot pin 50. This causes the locking finger portion 40 to be retracted to a position within the channel 36 of the body portion 12. At this point the connector 28a may be removed and a different connector positioned for another push test.

Accordingly, the apparatus 10 of the present invention provides a slide actuated holding clamp which may be constructed in accordance with conventional construction techniques relatively simply and inexpensively from widely available materials such as aluminum or steel. For strength purposes it is preferred that the locking member 14 be constructed from steel, and preferably heat treated for even further strength. The apparatus of the present invention further enables push tests to be conducted on connectors where a relatively large total push force is required to be exerted, without the use of relatively large diameter air cylinders which detract from the compactness of the holding clamp, and which typically add to the overall cost of the holding clamp.

Referring now to FIG. 6, there is shown an apparatus 100 in accordance with an alternative preferred embodiment of the present invention. Apparatus 100 is particularly well adapted for use where smaller push forces, typically totaling about 20 pounds of force total, is applied to the terminals, collectively, of a connector. The apparatus 100 generally includes a main body portion 102, an actuating member 104 and a locking member 106. In the preferred embodiment shown in FIG. 6 the main body portion 102 takes the form of an elongated cylinder having a generally circular shoulder portion 108 protruding therefrom. The shoulder portion 108 further has a flat portion 108a which allows the main body portion 102 to be mounted flush against a mounting block, which will be discussed in more detail momentarily. It will be appreciated, however, that the main body portion 102 could take a wide variety of forms without departing from the scope of the appended claims.

With reference to FIGS. 9–11, the main body portion 102 generally includes an elongated bore 110 which opens into a recessed portion 112. The bore 110, at a lowermost end portion 114 of the main body portion 102, includes an enlarged threaded portion 116 which engages a threaded end portion 117 of a fluid flow responsive actuating cylinder 122. The cylinder 122 has an actuating rod 120 linearly moveable relative thereto, which in turn has a threaded portion 118. Thus, the threaded end portion 117 can be threadably engaged with the main body portion 102 while the actuating rod 120 is free to move linearly within the bore 110 of the main body portion 102.

With specific reference to FIG. 7, a clevis 124 is provided for allowing the actuating member 104 to be coupled pivotally to the threaded end portion 118 of the actuating rod 120. The clevis 124 includes a threaded aperture 126 (also shown in FIGS. 9–11) which threadably engages with the threaded end portion 118 of the actuating rod 120. A locking pin 128 extends through apertures 130 in the clevis 124 and through a lower aperture 132 in the actuating member 104 to pivotally secure the actuating member 104 to the clevis 124. Thus, as the actuating rod 120 is urged linearly upwardly and downwardly in the drawings of FIGS. 9–11, the actuating member 104 is not only caused to move linearly therewith, but is also allowed to move pivotally relative to the clevis 124.

The actuating member 104 further includes a cut-out portion 134 having a sloped portion 136, the function of which will be described momentarily. An upper aperture 139 is included along with a rear-wall portion 137.

With brief reference to FIGS. 7 and 8, the locking member 106 includes a recessed portion 138, a pair of laterally aligned, elongated openings 140, a pair of upper apertures 142 disposed in an upper end portion 143, a shoulder portion 144, and a cut-off rear-wall portion 145. The recessed portion 138 is of a depth and width (note FIGS. 9–11) preferably sufficient to enable the actuating member 104 to reside therein in a manner such that an outer wall portion 146 of the actuating member 104 does not protrude outwardly of the main body portion 102. The actuating member 104 is secured to the locking member 106 by an upper locking pin 148 which extends through the upper apertures 142 in the locking member 106 and the aperture 139 in the actuating member 104. Accordingly, the actuating member 104 is able to move pivotally relative to the locking member 106. With brief reference to FIG. 12, it will be appreciated that the locking member 106 could optionally include a sloped lower corner portion 150 if so desired. The sloped lower corner portion 150 could be included to allow a connector member to be completely inserted within a mounting block without any interference from any portion of the locking member 106 when the locking member 106 is in its completely unlocked position. It is anticipated that, in most applications, the inclusion of sloped corner portion 150 will be preferred.

With reference now to FIGS. 7 and 9, the locking member 106 is coupled to the main body portion 102 via a locking pin 152 which extends completely through the main body portion 102 via a pair of laterally aligned apertures 153 and through the elongated openings 140 in the locking member 106. Thus, the combination of the locking pin 152 and the elongated openings 140 permit the locking member 106 to move not only linearly longitudinally along at least a small portion of the length of the main body portion 102, but also to move pivotally relative to the main body portion 102.

Referring now to FIGS. 9–11, the sequence of operation of the apparatus 100 will be described. Initially, the apparatus 100 is shown in its completely unlocked position in FIG. 9. The locking member 106 is completely withdrawn from an area 154 of a mounting block 156 which is adapted to support a connector body therein. At this stage the actuating rod 120 of the actuating cylinder 122 is at or near an outermost point of travel. This causes the actuating member 104 to position the locking member 106 upwardly in the drawing of FIG. 9 to a point where the locking pin 152 abuts the lowermost portion of each of the elongated openings 140. Since the upper apertures 142 in the locking member 106 are laterally offset from the elongated openings 140, as indicated by arrow 158 in FIG. 9, the maximum upward extension of the actuating rod 120 not only causes the locking member 106 to be moved upwardly relative to the main body portion 102, but also causes the locking member 106 to be urged pivotally slightly in a clockwise direction when viewing FIG. 9 such that the shoulder portion 144 of the locking member 106 is preferably withdrawn into the recessed portion 112 of the main body portion 102. The cut-off rear-wall portion 145 allows the locking member 106 to be completely withdrawn into the recessed portion 112 such that the shoulder portion 144 does not protrude from the main body portion 102. Thus, at this point a connector body can be inserted within the area 154 without any interference from the locking member 106. It will be noted that the sloped corner portion 150 has been included with the locking member 106 in FIGS. 9–11.

Referring now to FIG. 10, after a connector body 160 has been inserted into the interior 154 of the mounting block 156, the actuating cylinder 122 is actuated to cause the actuating rod 120 to be withdrawn (i.e., pulled downwardly in the drawing of FIG. 10). As the actuating rod 120 is withdrawn, the locking pin 152 abuttingly engages a section of the sloped portion 136 of the actuating member 104. As the actuating rod 120 continues to be urged downwardly, as indicated by directional arrow 162, the locking pin 152 forces the actuating member 106 to be urged rotationally in a counter-clockwise direction in the drawing of FIG. 10. This causes the locking member 106 to be rotated slightly counter-clockwise such that shoulder portion 144 is urged into a first locking position overlaying a portion of the connector body 160.

With reference to FIG. 11, as the actuating rod 120 continues to be withdrawn (i.e., moved downwardly), the locking pin 152 moves off of the sloped portion 136 of the actuating member onto the rearwall portion 137. The elongated openings 140 permit the locking member 106 to then be urged linearly downwardly while the locking pin 152 maintains the locking member 106 in overlaying engagement with the connector body 158. The actuating rod 120 is withdrawn until the shoulder portion 144 abuttingly engages the surface of the connector body 160 and firmly urges it into a second locked position in seated engagement within the mounting block 156. During the downward travel of the actuating rod 120 the locking pin 152 moves within the elongated openings 140, relatively speaking, toward the uppermost ends of the openings 140, as shown in FIG. 11. At this point a continued downward force applied by the actuating rod 120, in connection with the actuating member 104, serves to maintain the locking member 106 securely in engagement with the connector body 160. Thereafter, a pull or push force may be exerted on terminal members 164 within the connector body 160 by terminal pins 29 and the apparatus 100 securely holds the connector body 160 stationary against the applied force.

It should be appreciated that while the operation of the apparatus 100 has been described in connection with the application of a "pull" force, the apparatus 100 works equally well when "push" forces are exerted on terminal members within a connector body. In either instance, the apparatus 100 operates to securely hold the connector body 160 stationary relative to a mounting block 156 while the pull or push test is being conducted.

It will also be appreciated that the main body portion 102 could be formed in a variety of configurations to adapt it to specific mounting blocks. The cylindrical main body portion 102 is merely representative of one of many forms that the main body portion 102 could take. Also, the various components of the apparatus 10 or 100 could be manufactured from a wide variety of materials such as various plastics or even various metals provided same are of a suitably high strength.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A slide actuated holding clamp apparatus for holding a connector stationary while a push test is being performed on at least one conductor secured to said connector, in response to linear movement of a drive element, said apparatus comprising:

a body portion having a bore extending at least partially therethrough and an opening formed therein in communication with said bore;

a locking member disposed within said opening of said body portion, said locking member including a locking shoulder portion;

actuating means disposed slidably within said opening for causing said locking member to be urged into first and second locked positions relative to said connector in response to movement of said actuating means in a first direction by said drive element, and for urging said locking member out of locking engagement with said connector when said actuating means is moved in a second direction by said drive element;

said locking member including means cooperable with said actuating means for causing said locking member to be urged into said first locked position with said connector as said drive element is moved in said first direction; and said locking member including second means for allowing said locking member to be moved generally longitudinally within said opening into said second locked position as said drive element is further urged in said first direction, said second locked position causing said locking member to exert a positive clamping force against said connector to hold said connector securely during said push test;

said actuating means including a sloped portion;

said body portion including a locking pin extending at least partially therethrough; and said locking pin abuttingly engaging said sloped portion to thereby urge said actuating means away from said locking pin as said actuating means is urged in said first direction, thereby causing said locking member to be urged pivotally such that said locking shoulder portion is urged outwardly of said opening of said body portion in the abutting engagement with said connector.

2. The apparatus of claim 1, wherein said first means comprises at least one aperture in said locking member and a locking pin which pivotally couples said actuating means to said locking member at an upper end portion of said locking member to cause said locking member to be moved pivotally when said actuating means is moved in said first direction.

3. The apparatus of claim 1, wherein said second means comprises at least one elongated opening in said locking member and a locking pin extending through said elongated opening to thereby allow said locking member to be urged slidably and generally longitudinally within said opening in said body portion as said actuating means is moved in said first direction.

4. The apparatus of claim 1, further including a clevis for pivotally coupling an end portion of said actuating means with said drive element.

5. The apparatus of claim 1, wherein said opening comprises a recessed portion in the form of a channel extending a majority of the length of said locking member; and wherein said actuating means is adapted to fit within said recessed portion of said locking member and to be moved generally slidably therewithin.

6. The apparatus of claim 1, wherein said actuating means is pivotally coupled to said locking member at an upper end portion of said locking member.

7. A holding clamp apparatus for use in connection with an actuating device having a controllably linearly extendable and retractable actuating element, for holding a connector stationary while a push test or pull test is performed on at least one conductor secured to said connector, said clamp apparatus comprising:

a main body portion having a bore extended at least partially therethrough and a recessed opening formed therein in communication with said bore;

a locking member disposed within said opening in said main body portion, said locking member including a locking shoulder portion adapted to engage said connector, and means for coupling said locking member to said main body portion to allow said locking member to be moved generally linearly within said opening when said actuating element is moved in a first linear direction;

said locking member being movable into first and second locked positions in response to movement of said actuating element in said first direction;

an actuating member pivotally coupled to said locking member and said actuating element, said actuating member causing said locking member to be moved in a first pivotal direction when said actuating element is urged in said first linear direction;

said means for allowing said locking member to be moved generally linearly within said recessed opening causing said locking member to be urged in said first linear direction into a second locked position as said actuating element is moved in said first linear direction, thereby causing said locking shoulder portion of said locking member to exert a positive clamping force on said connector prior to one of said pull test and said push test being performed on said connector;

said means for allowing said locking member to be moved generally linearly within said opening comprising at least one elongated opening in said locking member and a locking pin for captively securing said locking member within said recessed opening of said main body portion;

said actuating member including a sloped portion;

said locking pin abuttingly engaging said sloped portion as said actuating member is moved in said first linear direction to cause said actuating member to urge said locking member into said first locked position, wherein said locking shoulder portion protrudes outwardly of said recessed opening of said main body portion; and a clevis for pivotally coupling said actuating member to an end portion of said actuating element.

* * * * *